United States Patent
Ashizawa

(10) Patent No.: US 6,990,034 B2
(45) Date of Patent: Jan. 24, 2006

(54) STATIC SEMICONDUCTOR MEMORY DEVICE AND METHOD OF CONTROLLING THE SAME

(75) Inventor: Tetsuo Ashizawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/636,543

(22) Filed: Aug. 8, 2003

(65) Prior Publication Data

US 2004/0042325 A1 Mar. 4, 2004

(30) Foreign Application Priority Data

Aug. 29, 2002 (JP) .............................. 2002-251785

(51) Int. Cl.
*G11C 7/00* (2006.01)

(52) U.S. Cl. ........................ 365/227; 365/156; 365/203

(58) Field of Classification Search ................ 365/154, 365/156, 203, 227
See application file for complete search history.

(56) References Cited

U.S. PATENT DOCUMENTS 5,734,604 A * 3/1998 Akamatsu et al. .......... 365/156
5,995,431 A * 11/1999 Inui et al. ................... 365/203
6,333,874 B2 * 12/2001 Yamauchi .............. 365/189.09

* cited by examiner

*Primary Examiner*—Son Mai
(74) *Attorney, Agent, or Firm*—Arent Fox PLLC

(57) ABSTRACT

A plurality of p-MOSFETs connected to a power supply line is turned on to precharge bit lines. A precharge cancel signal generated by a NOR circuit and an inverter performs precharge control to turn off the p-MOSFETs to set the bit lines in a floating state during the period of a standby mode, or turn on the p-MOSFETs to precharge the bit lines during the period of a read mode or write mode.

13 Claims, 5 Drawing Sheets

STATIC SEMICONDUCTOR MEMORY DEVICE AND METHOD OF CONTROLLING THE SAME

CROSS-REFERENCE TO RELATED APPLICATIONS

This application is based upon and claims the benefit of priority from the prior Japanese Patent Application No. 2002-251785, filed on Aug. 29, 2002, the entire contents of which are incorporated herein by reference.

BACKGROUND OF THE INVENTION

1. Field of the Invention

The present invention relates to a static semiconductor memory device and a method of controlling the same.

2. Description of the Related Art

A typical conventional static semiconductor memory device is an SRAM (Static Random Access Memory). FIG. 3 is a view showing the memory cell array of a conventional SRAM. As shown in FIG. 3, n memory cells CELL0, CELL1, . . . , CELLn (to be referred to as memory cells CELL hereinafter) are connected to a pair of bit lines BL and XBL. Each of the bit lines BL and XBL is connected to a power supply voltage (Vdd) through a precharge p-MOSFET 51. The signal line of a precharge cancel signal φ is connected to the gate terminals of the p-MOSFETs 51 so that the p-MOSFETs 51 are ON/OFF-controlled by the precharge cancel signal φ. Note that the bit lines BL and XBL have a complementary relationship.

Each memory cell CELL is formed from six transistors. Four of them, i.e., two p-MOSFETs 52a and two n-MOSFETs 52b construct a data latch circuit that holds data. Two remaining n-MOSFETs 53 control connection between the data latch circuit and the bit lines BL and XBL. Word lines WL0, WL1, . . . , WLn are connected to the gate terminals of the n-MOSFETs 53 that control connection to the bit lines BL and XBL. The n-MOSFETs 53 are ON/OFF-controlled by the signal of the word line WL. The above-described SRAM has a standby mode, write mode, and read mode. In the standby mode, the memory cell is neither write- nor read-accessed.

The arrangement of the above-described data latch circuit will be described in detail. The two p-MOSFETs 52a are respectively connected between nodes A and B and the power supply lines that supply the power supply voltage. The two n-MOSFETs 52b are connected between ground and the nodes A and B, respectively. The gate terminals and drain terminals of the p-MOSFETs 52a and n-MOSFETs 52b are connected to each other to form an inverter. The connection point between the gate terminals and that between the drain terminals (nodes A and B) are also connected. Thus, a data latch circuit is formed.

FIG. 4 is a waveform chart showing the operation of the memory cell array shown in FIG. 3. At time t70, the SRAM is in the read mode. The bit lines BL and XBL are kept at high level because the p-MOSFETs 51 are turned on. At time t71, the precharge cancel signal φ changes to high level to cancel precharge of the bit lines BL and XBL. In synchronism with this operation, the word line WL of the memory cell CELL to be accessed changes to high level to execute read operation (in the read mode). Referring to FIG. 4, a change in potential of the bit lines BL and XBL indicates the read operation.

At time t72, when the read operation is ended, the SRAM changes to the standby mode. The precharge cancel signal φ changes to low level to start precharging the bit lines BL and XBL. In the waveforms of the signals in write operation (in the write mode), only the change in potential of the bit lines BL and XBL is different from that in the waveforms of the signals in the above-described read operation.

In the above-described SRAM, since the bit lines BL and XBL are held at high level during the standby mode, a leakage current from the bit line BL or XBL to the memory cell CELL is generated.

For example, assume that the node A on the right side of the data latch circuit in the memory cell CELL0 shown in FIG. 3 holds low level. The node A is connected to the bit line XBL through the transistor 53. During the standby mode, the bit line XBL is precharged to high level. Hence, a leakage current Ioff flows from the bit line XBL to the node A. At the node B on the left side, since the two terminals (source and drain terminals) of the transistor 53 are at high level, no leakage current flows. In addition, as indicated by the memory cell CELLn, while the node B holds low level, the leakage current Ioff flows from the bit line BL to the node B.

As described above, the leakage current Ioff flows to the bit line BL or XBL in accordance with the data held by all the memory cells CELL. That is, in FIG. 3, since the n memory cells CELL are connected to the bit lines BL and XBL, a total leakage current Ioff×n flows to the bit line BL or XBL. When the above SRAM is used in a device such as a cellular phone with a very long standby time, the bit lines BL and XBL are always precharged to high level, and the leakage current continuously flows.

To reduce the leakage current of the memory cell CELL in the standby mode in the above-described SRAM, the bit lines BL and XBL are set in a floating state. FIG. 5 is a waveform chart when the method of setting the bit lines BL and XBL in the floating state is employed in the standby mode of the SRAM shown in FIG. 3. In this method, at time t80, the SRAM is in the read mode and in the non-access state for the memory cell CELL. Hence, the precharge cancel signal φ is changed to high level to set the bit lines BL and XBL in the floating state.

Next, at time t81, before accessing the memory cell CELL, the precharge cancel signal φ is changed to low level to precharge the bit lines BL and XBL. The timing to change the precharge cancel signal φ to low level corresponds to the trailing edge (or leading edge) of the clock signal, as shown in FIG. 5.

At time t82, the precharge cancel signal φ is changed to high level, and simultaneously, the word line WL is changed to high level to access the memory cell CELL. As described above, even during the read mode, the bit lines BL and XBL are set in the floating state in the non-access state for the memory cell CELL, thereby reducing the leakage current. In the access state, the bit lines BL and XBL are precharged before accessing the memory cell CELL. Then, the memory cell CELL is accessed.

At time t83, the SRAM is set in the standby mode. The word line WL is changed to low level, and the bit lines BL and XBL are set in the floating state. A time Ta from time t81 to t82 shown in FIG. 5 is necessary for precharging the bit lines BL and XBL. As shown in FIG. 5, the word line WL changes to high level with a delay corresponding to the time Ta from the trailing edge of the clock signal. The precharge cancel signal φ maintains low level for the time Ta and then changes to high level.

As described above, when the bit lines BL and XBL are in the floating state and have an arbitrary potential, the following leakage currents flow between the bit lines BL and XBL and the memory cell CELL: a leakage current Ioff_L (VBL) flowing from the bit lines BL and XBL to the above-described node A or B that has a lower potential (to be referred to as a low node hereinafter) and a leakage current Ioff_H (VBL) flowing from the above-described node A or B that has a higher potential (to be referred to as a high node hereinafter) to the bit lines BL and XBL. FIG. 6 shows the dependence between these leakage currents and the potential of the bit lines BL and XBL (VBL indicates the potential of the bit lines BL and XBL).

As shown in FIG. 6, the leakage current Ioff_L (VBL) that flows from the bit lines BL and XBL to the low node becomes small as the VBL becomes low. Conversely, the leakage current flows from the high node to the bit lines BL and XBL becomes small as the VBL becomes high. When the bit lines BL and XBL are set in the floating state, the potential of the bit lines BL and XBL stabilizes at the potential VBL=VBLo that satisfies $$\text{Ioff\_L}(VBL) \times (\text{number of ``L'' nodes connected to bit line } BL) =$$
$$\text{Ioff\_H}(VBL) \times (\text{number of ``H'' nodes connected to bit line } BL).$$

When m memory cells of the n memory cells CELL connected to a given bit line are high nodes, and (n−m) memory cells are low nodes, the leakage current is given by m×Ioff_L (VBLo)+(n−m)×Ioff_L (VXBLo) This is the minimum value. That is, when the bit lines BL and XBL are set in the floating state, the potential of the bit lines BL and XBL stabilizes in a state wherein the leakage current is minimized in accordance with the data held by the memory cell CELL.

In the above-described method of reducing the leakage current, the precharge cancel signal φ that sets the bit lines BL and XBL in the floating state and the select signal of the word line WL are generated on the basis of a clock signal. More specifically, in accordance with a change in clock signal, the precharge cancel signal φ is changed to low level to precharge the bit lines BL and XBL at the time t81, and then, the word line WL is changed to high level at the time t82. However, the time required to precharge the bit lines BL and XBL from the time t81 to t82 impedes an increase in access speed.

SUMMARY OF THE INVENTION

The present invention has been made in consideration of the above-described situation, and has as its object to provide a static semiconductor memory device which reduces a leakage current in a standby mode without decreasing the access speed, and a method of controlling the same.

The present invention has been made to solve the above-described problems, and a static semiconductor memory device according to the present invention and a method of controlling the device are characterized by comprising a plurality of precharge circuits which is turned on to precharge bit lines, wherein precharge control is performed to turn off the precharge circuits during the period of a standby mode and turn on the precharge circuits during the period of a read mode and write mode.

In the static semiconductor memory device and the method of controlling the device according to the present invention, the precharge circuits can be turned off during the period of the standby mode to set the bit lines in the floating state. Hence, the leakage current can be reduced. During the period of the read mode and write mode, the precharge circuits can always be kept on during a non-access period. Since the bit lines are already precharged during the non-access period, read or write operation can be performed immediately when the access period starts. With the above arrangement, the standby current can be reduced without decreasing the access speed.

DETAILED DESCRIPTION OF THE PREFERRED EMBODIMENTS

An embodiment of the present invention will be described below.

The schematic arrangement of a semiconductor device having an SRAM (Static Random Access Memory) according to an embodiment of the present invention and a control circuit of the SRAM will be described first with reference to the accompanying drawings.

Figure 1:
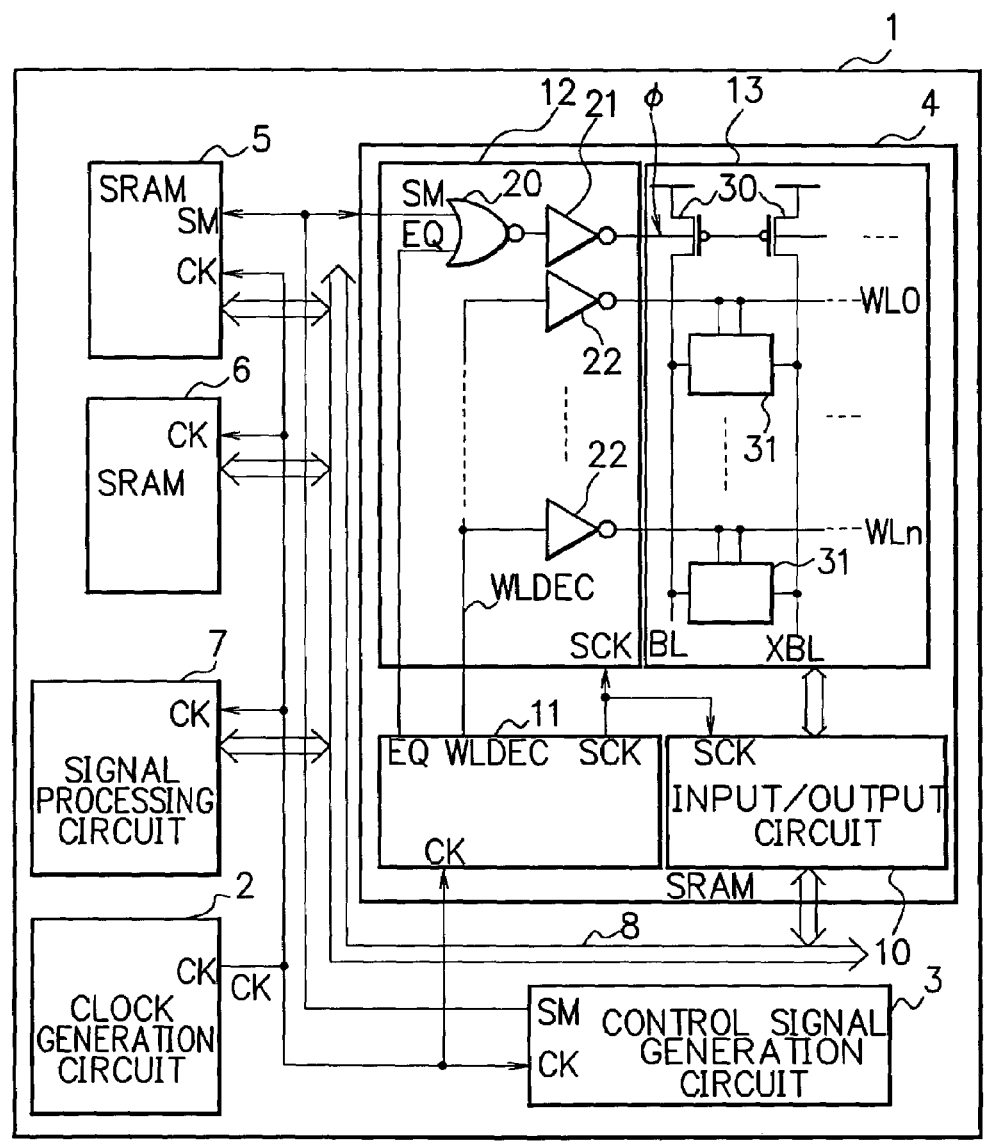
FIG. 1 is a block diagram showing the schematic arrangement of a semiconductor device having an SRAM according to an embodiment and a control circuit of the SRAM.

FIG. 1 is a block diagram showing the schematic arrangement of a semiconductor device having an SRAM according to an embodiment and a control circuit of the SRAM.

Referring to FIG. 1, a semiconductor device 1 executes signal processing in synchronism with a clock signal using a plurality of SRAMs. The semiconductor device 1 is, e.g., a system LSI (Large-Scale Integrated circuit). A clock generation circuit 2 supplies a clock signal CK as a reference of the signal processing timing to the semiconductor device 1. A control signal generation circuit 3 generates, on the basis of the clock signal CK generated by the clock generation circuit 2, various control signals which control the internal elements of the semiconductor device 1. More specifically, the control signal generation circuit 3 outputs a control signal (operation mode control signal) SM which controls the standby mode of SRAMs 4 and 5 of the semiconductor device 1. The control signal SM controls the SRAMs 4 and 5 to the standby mode at high level and controls the SRAMs 4 and 5 to a read or write mode at low level.

The SRAMs 4 and 5 and an SRAM 6 operate using the clock signal CK output from the clock generation circuit 2 as a timing reference and store data to be processed in the semiconductor device 1. The control signal SM output from the control signal generation circuit 3 is input to the SRAMs 4 and 5. The internal arrangement of the SRAM 4 will be described later in detail. A signal processing circuit 7 transmits/receives data to/from the SRAMs 4, 5, and 6 and processes the data signals. A data bus 8 transmits data to be exchanged between the SRAMs 4, 5, and 6 and the signal processing circuit 7 in the semiconductor device 1.

With the above arrangement, the semiconductor device 1 executes signal processing in synchronism with the clock signal CK generated by the clock generation circuit 2 using the SRAMs 4, 5, and 6 and signal processing circuit 7. During the non-access period for the SRAMs 4 and 5, the control signal SM is changed to high level to set the SRAMs 4 and 5 in the standby mode.

The schematic internal arrangement of the SRAM 4 will be described next.

An input/output circuit 10 processes data input/output to/from the SRAM 4 through the data bus 8. An internal clock/control signal generation circuit 11 has at least a function of generating a clock signal SCK serving as a reference of signal processing timing in the SRAM 4, a function (internal control signal generation circuit) of generating a bit line control signal (normal precharge control signal) EQ which controls precharge of bit lines BL and XBL, and a function (word line selection circuit) of generating a word line select signal WLDEC which controls selection of a word line. Detailed waveform examples of the bit line control signal EQ and word line select signal WLDEC will be described later.

A memory control circuit 12 controls read operation or write operation in a memory cell array 13 (to be described later) on the basis of the clock signal SCK or control signals (bit line control signal EQ, word line select signal WLDEC, and the like) from the internal clock/control signal generation circuit 11. In this embodiment, the memory control circuit 12 comprises at least a NOR circuit 20, inverter 21, and a plurality of inverters 22.

The control signal SM output from the control signal generation circuit 3 is input to one input terminal of the NOR circuit 20. The bit line control signal EQ output from the internal clock/control signal generation circuit 11 is input to the other input terminal. The output terminal of the NOR circuit 20 is connected to the input terminal of the inverter 21. The output terminal of the inverter 21 is connected to the gate terminal of p-MOSFETs (precharge circuits) 30 (to be described later). With the above-described arrangement (precharge control circuit) of the NOR circuit 20 and inverter 21, a precharge cancel signal $\phi$ (control signal) is output from the output terminal of the inverter 21 on the basis of the control signal SM and bit line control signal EQ. The word line select signal WLDEC output from the internal clock/control signal generation circuit 11 is input to the input terminals of the inverters 22. Word lines WL (to be described later) are connected to the output terminals of the inverters 22.

In the memory cell array 13, n memory cells 31 are connected to the pair of bit lines BL and XBL. Each of the bit lines BL and XBL is connected to a power supply voltage through the precharge p-MOSFETs (precharge transistors) 30. The signal line of the precharge cancel signal $\phi$ is connected to the gate terminal of the p-MOSFETs 30. The p-MOSFETs 30 are ON/OFF-controlled by the precharge cancel signal $\phi$.

Figure 3:
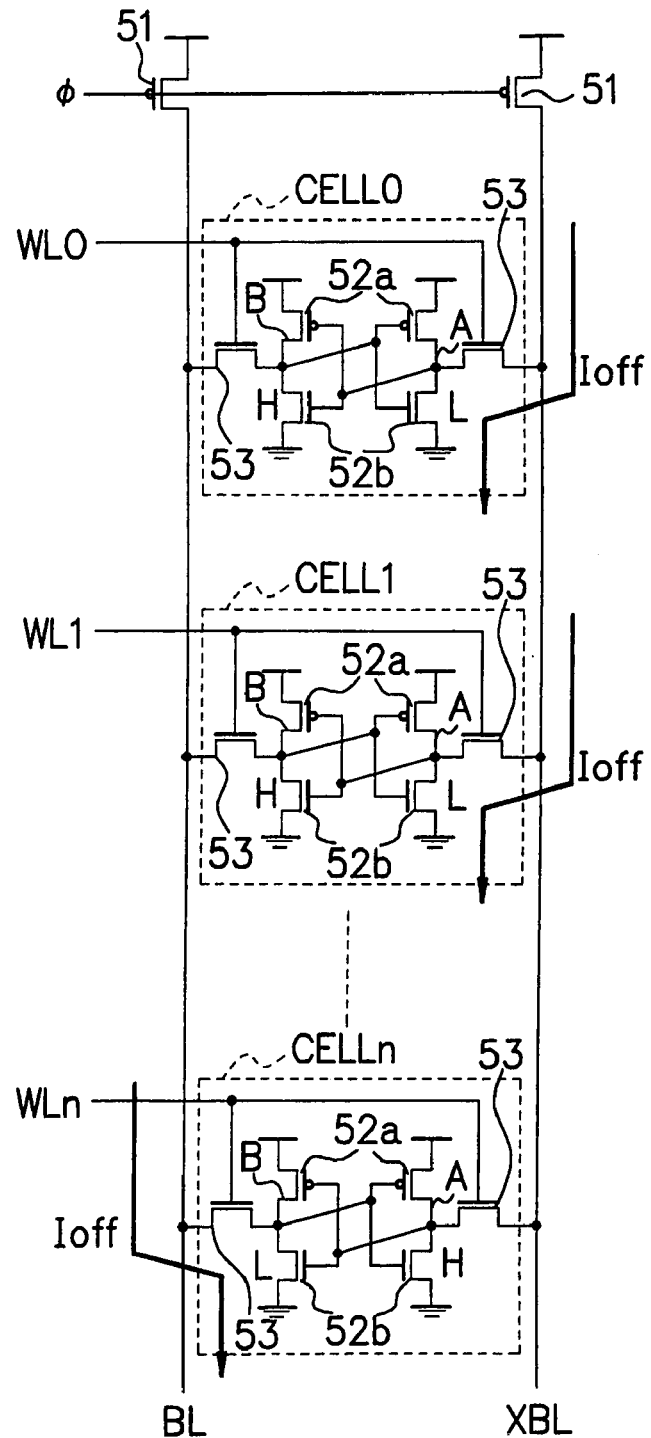
FIG. 3 is a view showing the memory cell array of a conventional SRAM.

The memory cell array 13 in which the pair of bit lines BL and XBL arranged in correspondence with each column of the memory cell array 13 and the word line WL arranged in correspondence with each row of the memory cell array 13 are connected to a memory cell M has the same arrangement as that of the memory cell array shown in FIG. 3. That is, the circuit arrangement of the memory cell 31 is the same as that of the memory cell CELL shown in FIG. 3, and a description thereof will be omitted. Additionally, connection between the memory cell 31 and the bit lines BL and XBL and connection of the word line WL are also the same as those of the arrangement shown in FIG. 3, and a description thereof will be omitted. The SRAM 5 also has the same arrangement as that of the SRAM 4 described above.

If, e.g., a standby control signal used in the semiconductor device 1 is available, the signal may be used as the control signal SM to be output from the control signal generation circuit 3. In this embodiment, as described above, the control signal SM changes to high level during the period (standby mode) when the SRAMs 4 and 5 incorporated in the semiconductor device 1 need not be accessed and changes to low level during the access period (normal operation mode).

The operation of the semiconductor device 1 shown in FIG. 1 will be described next.

Figure 2:
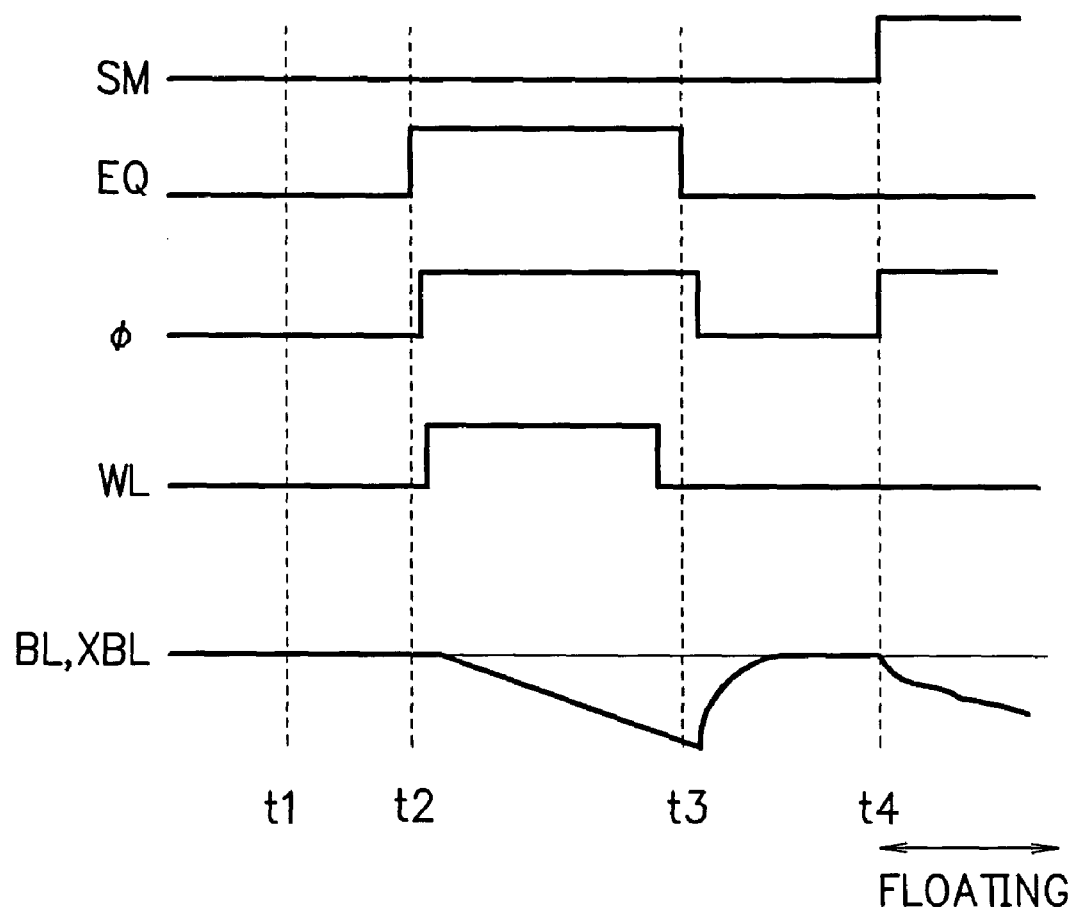
FIG. 2 is a waveform chart showing the operations of the SRAM 4 and semiconductor device 1 shown in FIG. 1.

FIG. 2 is a waveform chart showing the operations of the SRAM 4 and semiconductor device 1 shown in FIG. 1. Referring to FIG. 2, the normal operation mode (read mode or write mode) is set before time t4, and the standby mode is set from the time t4. First, at time t1 in the normal operation mode, the control signal SM is at low level, and the bit line control signal EQ is at low level. Accordingly, since the precharge cancel signal $\phi$ is at low level, and the p-MOSFETs 30 are turned on, the bit lines BL and XBL are precharged to high level. In addition, the word line WL is at low level before access to the memory cell 31. As described above, in the normal operation mode, the control signal SM controls the p-MOSFETs 30 such that the bit lines BL and XBL are always precharged.

At time t2, to start accessing the memory cell 31, the internal clock/control signal generation circuit 11 changes to the bit line control signal EQ to high level. Accordingly, since the precharge cancel signal $\phi$ changes to high level to turn off the p-MOSFETs 30, precharge of the bit lines BL and XBL is canceled. In addition, the internal clock/control signal generation circuit 11 selects, in accordance with the word line select signal WLDEC, the word line WL connected to the memory cell 31 to be accessed. The selected word line WL changes to high level. With the above operation, a data read (read processing) or data write (write processing) is executed for the selected memory cell 31 through the bit lines BL and XBL.

At time t3, to end access to the memory cell 31, the internal clock/control signal generation circuit 11 changes the bit line control signal EQ to low level. Accordingly, since the precharge cancel signal $\phi$ changes to low level to turn on the p-MOSFETs 30, the bit lines BL and XBL are precharged to high level. In addition, the internal clock/control signal generation circuit 11 does not select, in accordance with the word line select signal WLDEC, the word line WL connected to the memory cell 31 whose access should be ended. The unselected word line WL changes to low level. As described above, in the normal operation mode, the precharge cancel signal $\phi$ changes to low level, and the bit lines BL and XBL are precharged before the start of access to the selected memory cell 31. For this reason, immediately after the clock signal SCK changes, the selected word line WL can change to high level to access the memory cell 31.

At the time t4, to set the SRAM 4 in the standby mode, the control signal generation circuit 3 changes the control signal SM to high level. Accordingly, the precharge cancel signal $\phi$ changes to high level to turn off the p-MOSFETs 30. For this reason, precharge of the bit lines BL and XBL is canceled, and the bit lines BL and XBL are set in the floating state. With the above operation, the SRAM 4 can reduce the leakage current by setting the bit lines BL and XBL in the floating state.

Figure 4:
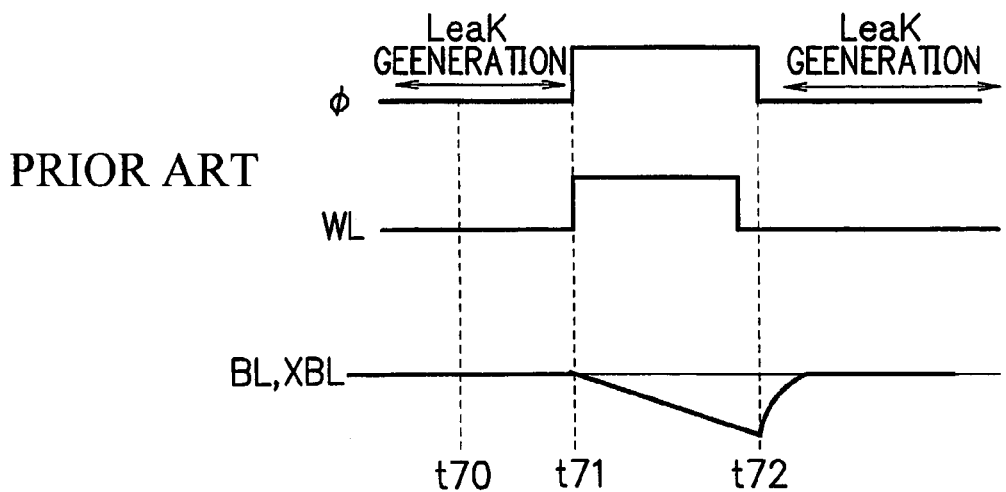
FIG. 4 is a waveform chart showing the operation of the memory cell array shown in FIG. 3.
Figure 5:
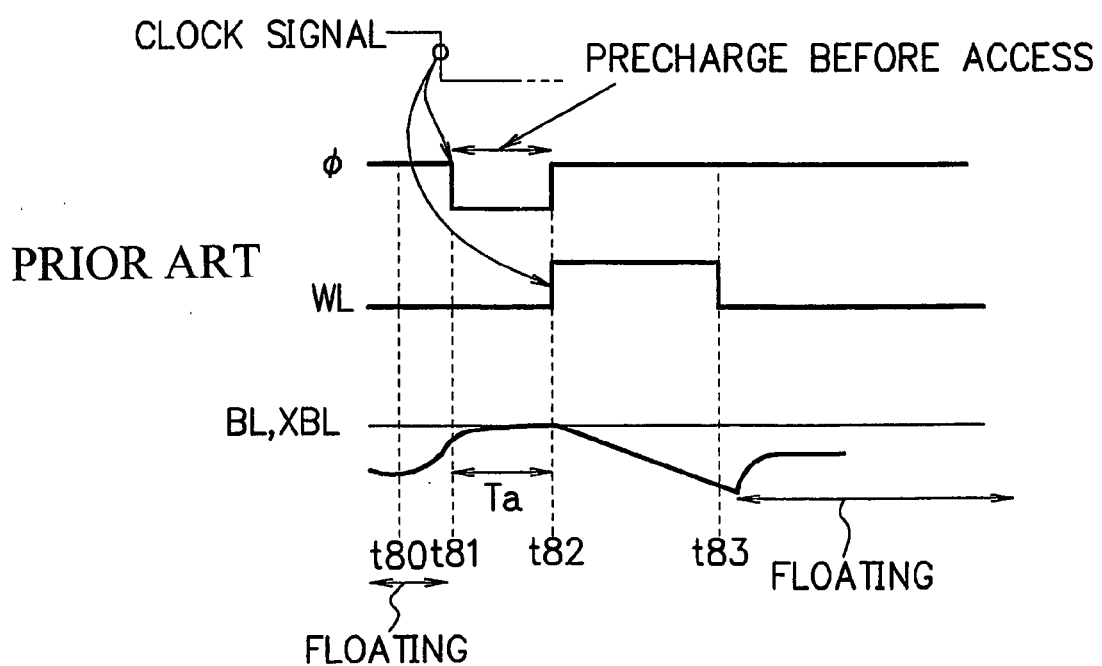
FIG. 5 is a waveform chart in a method of setting bit lines BL and XBL in a floating state in the standby mode of the SRAM shown in FIG. 3.
Figure 6:
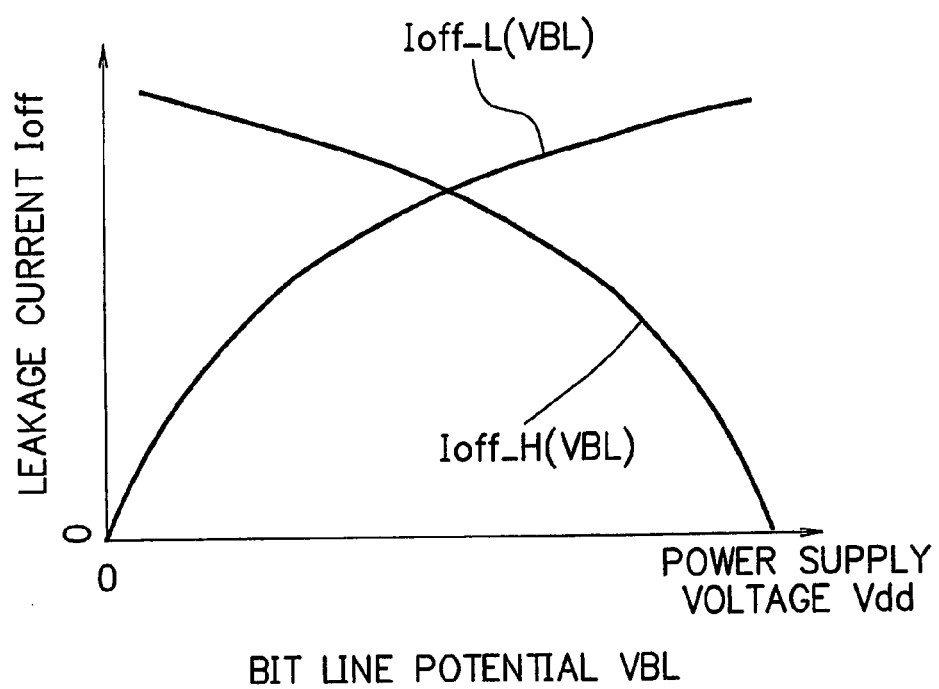
FIG. 6 is a graph showing the dependence between leakage currents from bit lines to a memory cell and the potential of the bit lines in the SRAM shown in FIG. 3.

As described above, in the normal operation mode before the time t4, the same operation as the conventional operation shown in FIG. 4 is performed. When access to the memory cell 31 is ended, the precharge cancel signal φ changes to low level to precharge the bit lines BL and XBL. Hence, when the memory cell 31 is accessed next time, the bit lines BL and XBL have already been precharged to high level. The time Ta for precharge is unnecessary after the change of the clock signal SCK, unlike the prior art shown in FIG. 6. Hence, the semiconductor device 1 can increase the access speed to the SRAM 4.

When the SRAM 4 is set in the standby mode, the control signal SM changes to high level to set the bit lines BL and XBL in the floating state. In the standby mode, the leakage current flowing from the bit lines BL and XBL to the memory cell 31 can be reduced as compared to the conventional operation shown in FIG. 4.

In the above-described embodiment, an SRAM has been exemplified. However, the present invention is not limited to this. The embodiment can also suitably be applied to any other static semiconductor memory devices which generate a leakage current due to precharge of bit lines in the standby mode.

The embodiment of the present invention has been described above in detail with reference to the accompanying drawings. However, a detailed arrangement is not limited to the embodiment, and a design without departing from the spirit and scope of the invention is also incorporated in the invention.

As has been described above, in the static semiconductor memory device according to the present invention and a method of controlling the device, a plurality of precharge circuits which precharges a plurality of bit lines is prepared. Precharge control is performed to turn off the precharge circuits during the period of the standby mode and turn on the precharge circuits during the period of the read mode and write mode. Since the bit lines can be set in the floating state during the period of the standby mode, the leakage current can be reduced. Since the precharge circuits are turned on during the period of the read mode and write mode, the bit lines can be precharged during the non-access period and need not be precharged during the access period.

Since the bit lines are already precharged during the non-access period, the read or write operation can be performed immediately when the access period starts. Accordingly, the leakage current in the standby mode can be reduced without decreasing the access speed. Especially, when an externally input control signal which controls switching of the standby mode is used for precharge control, precharge can be controlled before the change in internal clock of the static semiconductor memory device.

What is claimed is:

1. A static semiconductor memory device having a standby mode and normal operation mode as operation modes, comprising:
   a memory cell array having static memory cells arrayed in a matrix;
   a word line arranged in correspondence with each row of said memory cell array;
   a pair of bit lines arranged in correspondence with each column of said memory cell array;
   a plurality of precharge circuits which precharge said bit lines;
   a precharge control circuit which generates and outputs a precharge control signal which controls said precharge circuits, on the basis of an operation mode signal which is externally input to specify a period of the standby mode and a period of the normal operation mode;
   a word line selection circuit which controls access to the static memory cells by outputting a word line select signal which selects the word line; and
   an internal control signal generation circuit which outputs a normal precharge control signal which changes in synchronism with the word line select signal output from said word line selection circuit and controls precharge of said bit lines,
   wherein said precharge control circuit outputs, as the precharge control signal, the normal precharge control signal during the period of the normal operation modes, and
   wherein said word line select signal is independent of said precharge control signal.

2. The device according to claim 1, wherein
   said static semiconductor memory device is incorporated in a system, and
   the operation mode signal is a control signal supplied from said system.

3. The device according to claim 2, wherein
   the device further comprises
   a word line selection circuit which controls access to the static memory cells by outputting a word line select signal which selects the word line, and
   an internal control signal generation circuit which outputs a normal precharge control signal which changes in synchronism with the word line select signal output from said word line selection circuit and controls precharge of said bit lines, and
   said precharge control circuit outputs, as the precharge control signal, the normal precharge control signal during the period of the normal operation mode.

4. The device according to claim 1, wherein during the period of the normal operation mode, said precharge control circuit outputs a control signal which turns on said precharge circuits in an access state for the static memory cells and turns off said precharge circuits in a non-access state for the static memory cells.

5. The device according to claim 2, wherein during the period of the normal operation mode, said precharge control circuit outputs a control signal which turns on said precharge circuits in an access state for the static memory cells and turns off said precharge circuits in a non-access state for the static memory cells.

6. The device according to claim 1, wherein during the period of the standby mode, said precharge control circuit turns off said precharge circuits to set said bit lines in a floating state.

7. The device according to claim 2, wherein during the period of the standby mode, said precharge control circuit turns off said precharge circuits to set said bit lines in a floating state.

8. The device according to claim 3, wherein during the period of the standby mode, said precharge control circuit turns off said precharge circuits to set said bit lines in a floating state.

9. A method of controlling a static semiconductor memory device having a standby mode and normal operation mode as operation modes,
   the static semiconductor memory device comprising a memory cell array having static memory cells arrayed in a matrix, a word line arranged in correspondence with each row of the memory cell array, a pair of bit lines arranged in correspondence with each column of the memory cell array, and a plurality of precharge circuits which precharge the bit lines, comprising:

a control step of controlling the precharge circuits on the basis of an operation mode signal which is externally input to specify a period of the standby mode and a period of the normal operation mode, an access control step of controlling access to the static memory cells by outputting a word line select signal which selects the word line, and a bit line control step of outputting a normal precharge control signal which changes in synchronism with the word line select signal output in the access control step and controls precharge of the bit lines, in the control step, the precharge circuits are turned on/off in accordance with the normal precharge control signal output in the bit line control step during the period of the normal operation mode and, wherein said word line select signal is independent of said normal precharge control signal.

10. The method according to claim 9, wherein in the control step, during the period of the normal operation mode, control is performed to turn on the precharge circuits in an access state for the static memory cells and turn off the precharge circuits in a non-access state for the static memory cells.

11. The method according to claim 9, wherein in the control step, during the period of the standby mode, the precharge circuits are turned off to set the bit lines in a floating state.

12. The method according to claim 10, wherein in the control step, during the period of the standby mode, the precharge circuits are turned off to set the bit lines in a floating state.

13. The device according to claim 1, wherein
the word line select signal outputted by said word line selection circuit is inputted to said word line via an inverter.

* * * * *